United States Patent
Cheng et al.

(10) Patent No.: US 8,251,422 B2
(45) Date of Patent: Aug. 28, 2012

(54) APPARATUS FOR TRANSFERRING ELECTRONIC COMPONENTS IN STAGES

(75) Inventors: Chi Wah Cheng, Tsing Yi (HK); Wang Lung Tse, North Point (HK); Leung Por Chan, Tsing Yi (HK)

(73) Assignee: ASM Assembly Automation Ltd, Hong Kong (HK)

( * ) Notice: Subject to any disclaimer, the term of this patent is extended or adjusted under 35 U.S.C. 154(b) by 135 days.

(21) Appl. No.: 12/748,777

(22) Filed: Mar. 29, 2010

(65) Prior Publication Data
US 2011/0236161 A1    Sep. 29, 2011

(51) Int. Cl.
*H01L 21/673* (2006.01)
*H01L 21/677* (2006.01)

(52) U.S. Cl. ........................ 294/183; 294/188
(58) Field of Classification Search ................... 294/183, 294/65, 186, 188, 189; 901/40; 269/21; 279/3; 414/222.01
See application file for complete search history.

(56) References Cited

U.S. PATENT DOCUMENTS

| | | | | |
|---|---|---|---|---|
| 4,931,341 A | * | 6/1990 | Haffer et al. | 294/189 |
| 5,013,075 A | * | 5/1991 | Littell | 294/189 |
| 6,227,008 B1 | * | 5/2001 | Shetterly et al. | 294/188 |
| 6,446,354 B1 | | 9/2002 | Na | |
| 2001/0011828 A1 | * | 8/2001 | Ujita et al. | 294/64.1 |
| 2009/0311087 A1 | | 12/2009 | Na et al. | |
| 2010/0289283 A1 | * | 11/2010 | Watanabe et al. | 294/64.1 |
| 2010/0314894 A1 | * | 12/2010 | Watanabe et al. | 294/64.1 |

FOREIGN PATENT DOCUMENTS

| | | | |
|---|---|---|---|
| JP | 3-35990 | * | 2/1991 |
| JP | 6-91576 | * | 4/1994 |

* cited by examiner

*Primary Examiner* — Paul T Chin
(74) *Attorney, Agent, or Firm* — Ostrolenk Faber LLP

(57) ABSTRACT

A transfer assembly for transferring first and second groups of electronic components simultaneously comprises a holding plate containing first and second sets of suction holes. The respective first and second sets of suction holes are operative to hold the first and second groups of electronic components respectively against the holding plate during transfer of the electronic components. A first vacuum chamber located next to the holding plate is connected only to the first set of suction holes. A vacuum compartment located within the first vacuum chamber encloses a second vacuum chamber. The vacuum compartment includes a sealing sheet in contact with the holding plate which has vacuum holes connecting the second vacuum chamber to the second set of suction holes. First and second vacuum sources are provided for applying vacuum suction forces separately in the first and second vacuum chambers.

12 Claims, 5 Drawing Sheets

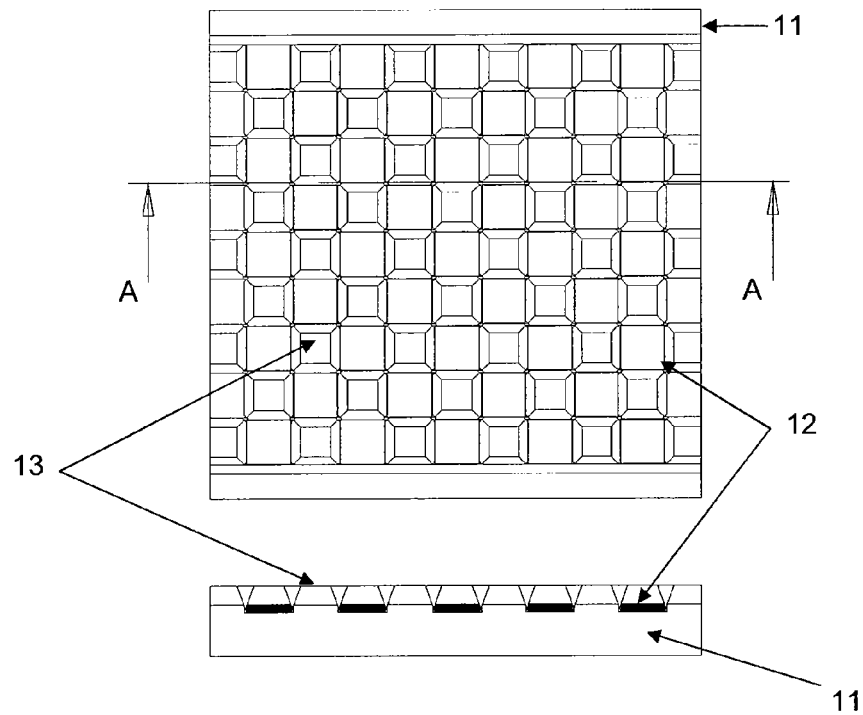
FIG. 1A (Prior Art)
FIG. 1B (Prior Art)
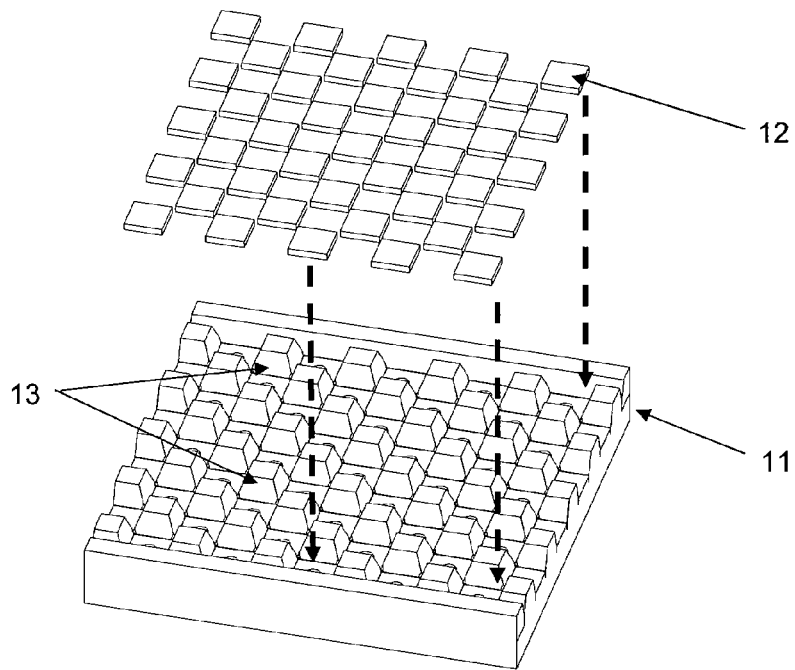
FIG. 1C (Prior Art)

APPARATUS FOR TRANSFERRING ELECTRONIC COMPONENTS IN STAGES

FIELD OF THE INVENTION

The present invention relates to an apparatus for transferring electronic components, and in particular, for transferring singulated electronic components onto a package holder in stages.

BACKGROUND AND PRIOR ART

The picking-up and transferring of electronic components, such as semiconductor packages that have been singulated on a mounting tape or a singulation jig, is one of the key back-end processes for the manufacture of electronic packages like Ball Grid Array ("BGA") packages, Quad Flat No-lead ("QFN") packages and Chip-Scale Packages ("CSP").

An example of a pick-up and sorting apparatus is disclosed in U.S. Pat. No. 6,446,354 entitled "Handler System for Cutting a Semiconductor Package Device". The singulated packages are picked up by a vacuum head and are washed with water and dried while being held by the vacuum head. After cleaning and drying, the packages are placed onto a hot plate having an array of small vacuum holes for further drying and lead/ball surface inspection. Half of the packages are placed onto a turntable with a buffer plate on top, with pockets arranged in an alternating format. The remaining packages are put onto the second half of the buffer plate. The buffer plate rotates when required to position the packages in a preferred orientation before the packages are picked up by dual offloading pick arms. The packages are individually picked up by multiple vacuum heads on the dual offloading pick arms which transfer the packages to a position opposite the offloading device for mark inspection. The packages are further transferred to a tray or a tube according to the inspection results.

This method is undesirable in that a complicated buffer plate with guiding walls in each pocket are required in order to accommodate the packages. Therefore, more expensive fabrication methods are required. There is also a possibility that the singulated packages do not fit securely into the pockets of the buffer plate. A sufficient clearance between the walls and the packages is essential to achieve accurate placement of the packages into the pockets of a tray or insertion into a tube, and the clearance cannot be too small resulting in unstable positioning of packages on the buffer plate. This problem of having to provide sufficient clearance is especially pronounced when handling smaller packages (e.g. 2×2 mm and 3×3 mm).

US Publication Number 2009/0311087 A1 entitled "Apparatus For Picking Up Semiconductor Package" discloses a sorting apparatus which deals with the problem of transferring small packages. The patent discloses a dual layer picker base comprising upper and lower bases with each base housing a pneumatic line providing a separate air source and vacuum suction to each base through suction holes on a suction pad for picking up and transferring packages to a package holder.

By providing two separate pneumatic lines within the dual layer structures, two vacuum or air sources are available for transferring the packages in the required alternating format in separate stages. However, this dual-layer picker base design requires complex and costly components which are difficult to machine. Therefore, it would be desirable to devise a simpler and cheaper design that reduces manufacturing difficulty while achieving the same function of releasing electronic packages in stages in an alternating format.

SUMMARY OF THE INVENTION

It is thus an object of the invention to seek to provide a pick and transfer apparatus which effectively picks up and transfers singulated electronic components which has fewer parts and is easier to manufacture as compared to the prior art.

According to a first aspect of the invention, there is provided a transfer assembly for transferring first and second groups of electronic components simultaneously, comprising: a holding plate containing first and second sets of suction holes, wherein the respective first and second sets of suction holes are operative to hold the first and second groups of electronic components respectively against the holding plate during transfer of the electronic components; a first vacuum chamber located next to the holding plate which is connected only to the first set of suction holes; a vacuum compartment located within the first vacuum chamber and which encloses a second vacuum chamber that is separate from the first vacuum chamber, the vacuum compartment including a sealing sheet in contact with the holding plate which has vacuum holes connecting the second vacuum chamber to the second set of suction holes; and a first vacuum source for applying vacuum suction force in the first vacuum chamber but not the second vacuum chamber, and a second vacuum source for applying suction force in the second vacuum chamber but not the first vacuum chamber.

According to a second aspect of the invention, there is provided a transfer assembly for transferring first and second groups of electronic components simultaneously, comprising: a holding plate containing first and second sets of suction holes, wherein the respective first and second sets of suction holes are operative to hold the first and second groups of electronic components respectively against the holding plate during transfer of the electronic components; a sealing sheet in contact with the holding plate which has vacuum holes connecting to the second set of suction holes; a vacuum chamber located next to the holding plate which surrounds side surfaces of the sealing sheet and is connected only to the first set of suction holes; a first vacuum source for applying vacuum suction force in the vacuum chamber; and a second vacuum source for applying vacuum suction force in the vacuum holes of the sealing sheet.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which:

FIGS. 1A to 1C are different views of an exemplary package tray which is configured to receive singulated electronic packages in an alternating format;

DETAILED DESCRIPTION OF THE PREFERRED EMBODIMENT OF THE INVENTION

Figure 2:
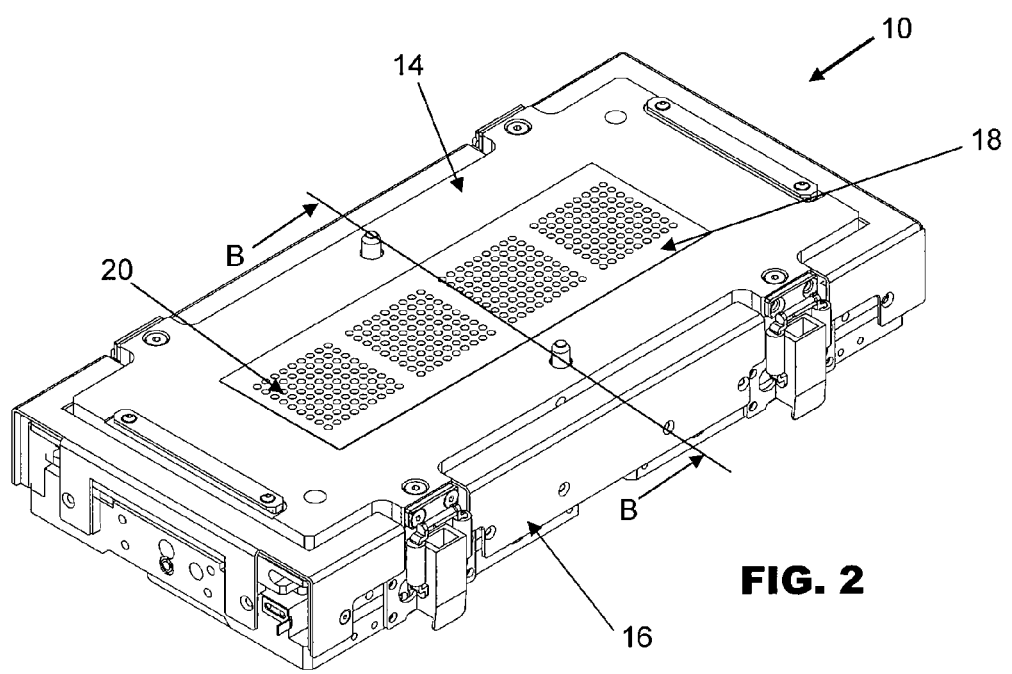
FIG. 2 is an isometric view of a flipper assembly according to the preferred embodiment of the invention.

The preferred embodiment of the present invention will be described hereinafter with reference to the accompanying drawings.

FIGS. 1A to 1C are different views of an exemplary package tray 11 which is configured to receive electronic components such as singulated electronic packages in an alternating format. FIG. 1A is a plan view of the package tray 11. The electronic packages 12 are placed on the package tray 11 in an arrangement where each electronic package 12 is spaced from the next one by a post 13 that does not receive electronic packages 12.

FIG. 1B is a cross-sectional view of the package tray 11 looking along line A-A of FIG. 1A. The arrangement of the electronic packages 12 in an alternating format can be seen in this view.

FIG. 1C is an isometric view of the package tray 11 showing the electronic packages 12 aligned on the package tray 11 in an alternating format and separated from one another by posts 13.

FIG. 2 is an isometric view of a transfer assembly in the form of a flipper assembly 10 according to the preferred embodiment of the invention, which is used for transferring electronic packages 12. The flipper assembly 10 generally comprises a holding plate or top plate 14 and a base block 16 supporting the top plate 14. The top plate 14 further comprises a package holding surface 18 on which numerous perforations or suction holes 20 are formed. Each suction hole 20 is configured for holding an electronic package 12 by way of vacuum suction acting from underneath the package holding surface 18. There are respective first and second sets of suction holes 20 which are operative to hold first and second groups of electronic packages 12 respectively against the package holding surface 18 of the top plate 14 during transfer of the electronic packages 12. Thus, the top plate 14 is configured to hold equal numbers of the first and second groups of electronic packages 12.

Figure 3:
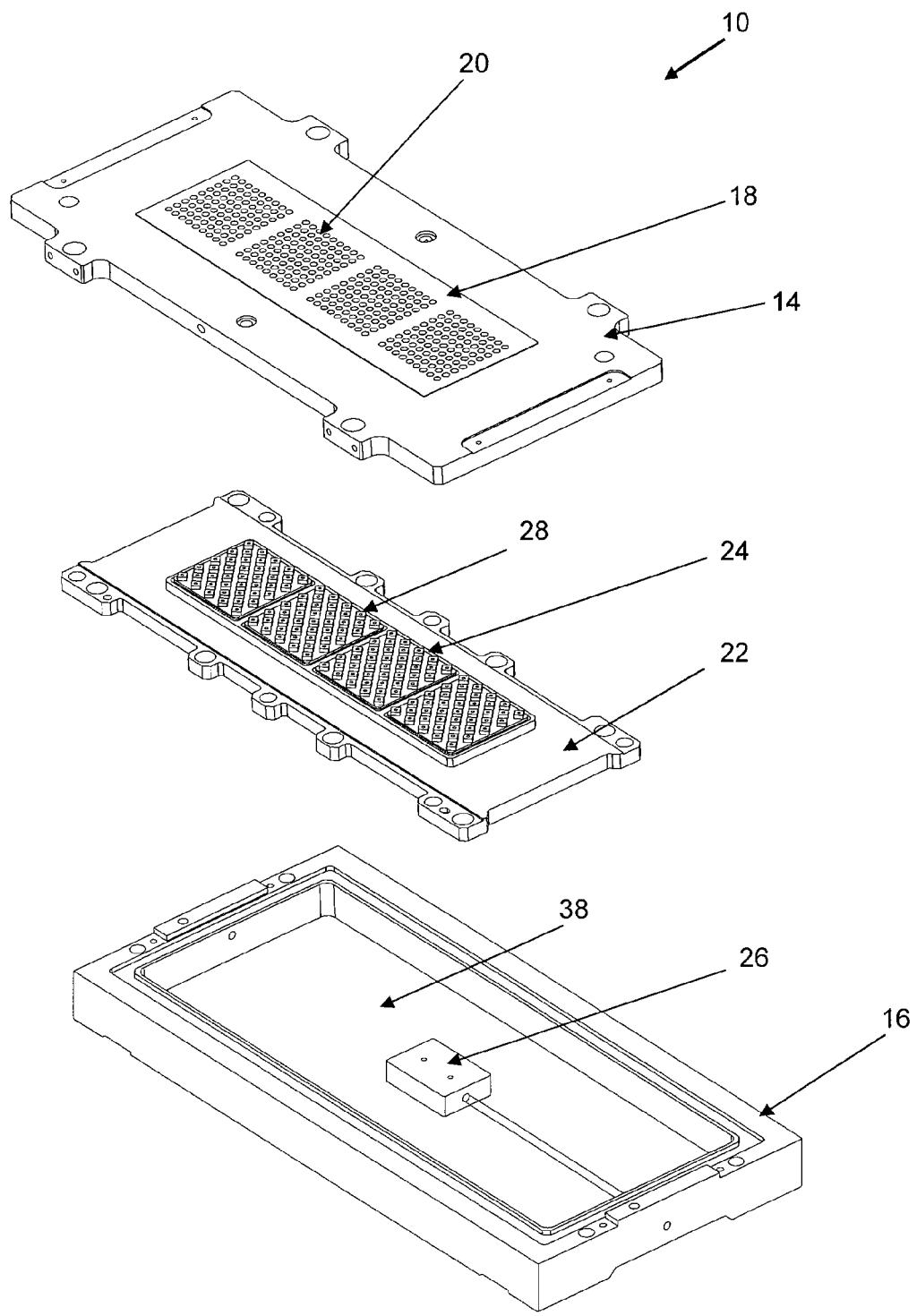
FIG. 3 is an exploded isometric view of the flipper assembly of FIG. 2.

FIG. 3 is an exploded isometric view of the flipper assembly 10 of FIG. 2. There is a first vacuum chamber 38 located next to the top plate 14. Inserted within the flipper assembly 10 and located entirely within the first vacuum chamber 38 in the base block 16 is a support such as a sealing sheet support 22 to which one or more sealing sheets 24 made from a compliant material are mounted. The compliant material may be rubber. The sealing sheets 24 are in contact with the top plate 14.

Multiple vacuum holes 28 are located on the sealing sheets 24. The vacuum holes 28 are connected to half of the suction holes 20, constituting the second set of suction holes 20, in an alternating format. The top plate 14 is removably attachable to the base block 16. The sealing sheet support 22 is insertable into the first vacuum chamber 38 after removal of the top plate 14 from the base block 16.

Figure 4:
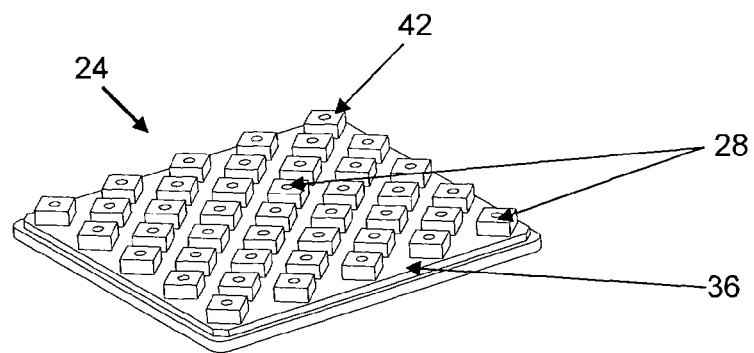
FIG. 4 is an isometric view of a sealing sheet used with the flipper assembly.

FIG. 4 is an isometric view of a sealing sheet 24 used in the flipper assembly 10. The sealing sheet 24 may comprise a sheet of rubber and is supported on the sealing sheet support 22 in the flipper assembly 10. Multiple protrusions 42 are arranged diagonally across the sealing sheet 24 in multiple rows, each having a through hole or vacuum hole 28 extending through the sealing sheet 24. Recessed slots 36 are formed between adjacent protrusions 42, which are interconnected to form a continuous passageway for the passage of pressurized air in between the protrusions 42. The protrusions are located at positions of the second set of suction holes 20 while the recessed slots 36 are located at positions of the first set of suction holes 20.

Figure 5:
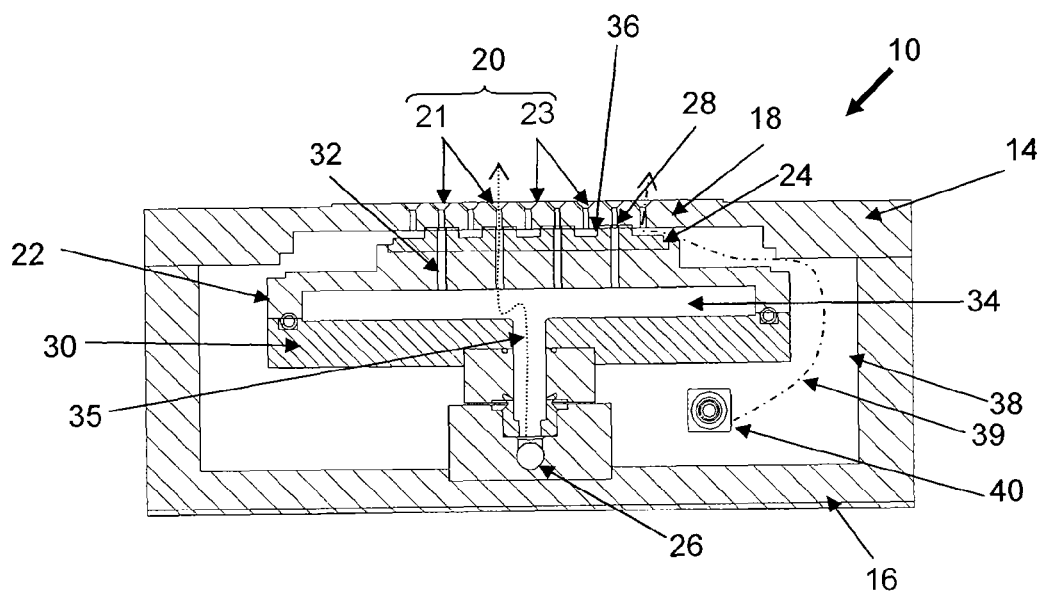
FIG. 5 is a cross-sectional view of the flipper assembly looking along line A-A of FIG. 2.

FIG. 5 is a cross-sectional view of the flipper assembly 10 looking along line B-B of FIG. 2. The suction holes 20 on the package holding surface 18, which is supported on the top plate 14, comprise first and second sets of equally-spaced suction holes 21, 23 arranged in an alternating format.

Each of the first set of suction holes 23 leads to a recessed slot 36 of the sealing sheet 24 located between adjacent protrusions 42 and pneumatic channels 32 located on the sealing sheet support 22. The recessed slots 36 are open spaces which are interconnected to form a continuous passageway to enable fluid communication between each suction hole 20 of the first set of suction holes 20 and the first vacuum chamber 38. The first vacuum chamber 38 surrounds side surfaces of the sealing sheet 24 and is connected to a first air source 40 which provides vacuum suction or an air supply to the first vacuum chamber 38 to hold electronic packages 12 over the first set of suction holes 23. The first air source 40 does not provide vacuum suction or an air supply to the second vacuum chamber 34. This arrangement forms a first pneumatic path 39 indicated in FIG. 5 as a dotted line which originates from the first air source 40, through the first vacuum chamber 38 before leading to the interconnected recessed slots 36 and finally the first set of suction holes 23.

Each of the second set of suction holes 21 is connected to the vacuum holes 28 of the sealing sheets 24 and pneumatic channels 32 located in the sealing sheet support 22. The sealing sheet support 22 forms a wall of a vacuum compartment which encloses a second vacuum chamber 34. The vacuum compartment is generally made up of the sealing sheet support 22 and a sealing sheet support mount 30. The second vacuum chamber 34 is further connected to a second air source 26, which is located at a base of the base block 16.

The second air source 26 provides vacuum suction to hold electronic packages 12 against the second set of suction holes 21 connected to the vacuum holes 28 of the sealing sheets 24 or expels air through the vacuum holes 28 to release the electronic packages 12 from the same. The second air source 26 does not provide vacuum suction or an air supply to the first vacuum chamber 38.

The second air source 26 generates a second pneumatic path 35 indicated in FIG. 5 by a dotted line which originates from the second air source 26, through the second vacuum chamber 34 before leading to the multiple pneumatic channels 32, the vacuum holes 28 and the second set of suction holes 21.

Therefore, the flipper assembly 10 provides two separate pneumatic paths 35, 39 using a single sealing layer. The sealing sheet 24 serves as a separator separating the first and second pneumatic paths 35, 39 of the flipper assembly 10, thereby sealing the second set of suction holes 21 and making it possible to place or remove a full array of singulated electronic packages 12 in stages onto the package holding surface 18 in an alternating format.

Figure 6A:
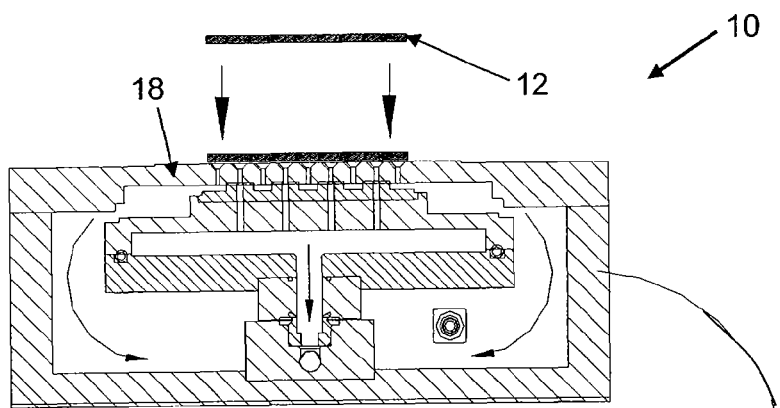
FIGS. 6A to 6D are cross-sectional views of the flipper assembly of FIG. 2 illustrating a working sequence of the flipper assembly when picking up and transferring electronic packages including a flipping action.

FIGS. 6A to 6D are cross-sectional views of the flipper assembly 10 of FIG. 2 illustrating a working sequence of the flipper assembly 10 when picking up and transferring electronic packages 12 including a flipping action. In FIG. 6A, an array of singulated electronic packages 12 are placed onto the package holding surface 18 after aligning each package 12 with a suction hole 20. The packages 12 are held tightly by a vacuum holding force provided through both the first and second pneumatic paths 35, 39 as described in FIG. 5. The first pneumatic path 35 holds a first half of the packages 12 and the second pneumatic path 39 holds a second half of the packages 12.

Figure 6B:
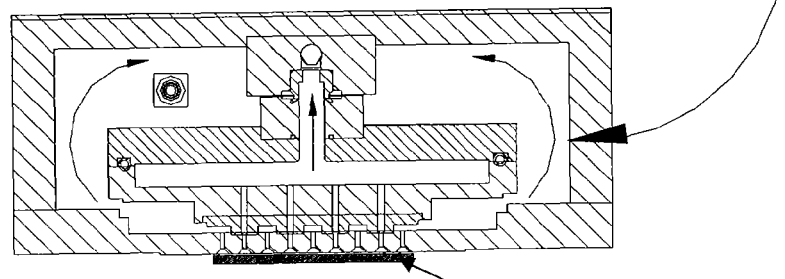
Figure 6C:
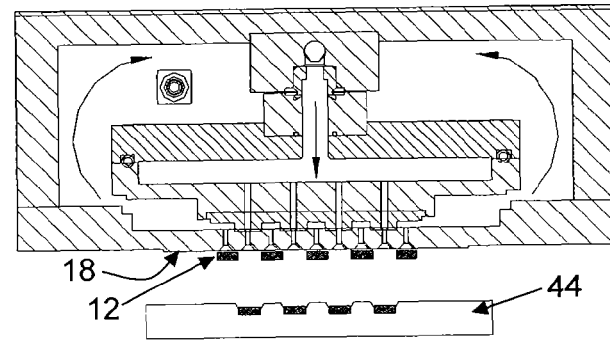

The flipper assembly 10 flips or rotates by an angle of 180° as shown in FIG. 6B while the singulated packages 12 are held by the vacuum force from both the first and second pneumatic paths 35, 39. Once the array of singulated electronic packages 12 is positioned over a package holder 44 as shown in FIG. 6C, the first pneumatic path 35 changes from vacuum suction to air blow so that a first half of the packages 12 is released onto the package holder, which may be a first buffer boat 44, in an alternating format. At the same time, the remaining packages 12 are still held by the vacuum force from the second pneumatic path 39 against the package holding surface 18. The first buffer boat 44 moves away and a second buffer boat 45 stands by underneath the flipping assembly 10 to receive the second half of the packages 12.

Figure 6D:
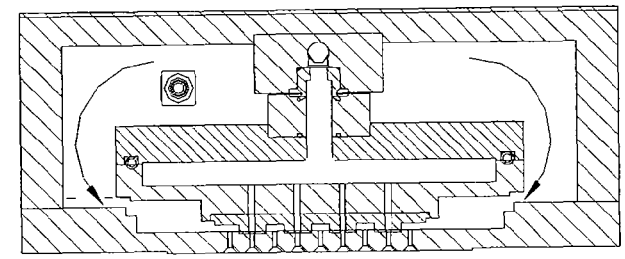

In FIG. 6D, the second pneumatic path 39 changes from vacuum suction to air blow so that the second half of the packages 12 are aligned and released onto the second buffer boat 45, also in an alternating format. The flipper assembly 10 then flips back to the receiving position to receive another array of singulated electronic packages 12.

It should be appreciated that the preferred embodiment of the flipper assembly 10 as described above provides a cost-effective apparatus for transferring singulated packages. The single layer design allows the transfer and arrangement of singulated packages to be released in an alternating format using the flipping assembly 10 with a simpler design as compared to the aforesaid prior art. The separation of the first and second pneumatic paths 35, 39 only requires the sealing sheet 24 which comprises a single sheet of material having a low manufacturing cost. As there are fewer parts, the overall cost of the flipper assembly is thus reduced.

The invention described herein is susceptible to variations, modifications and/or additions other than those specifically described and it is to be understood that the invention includes all such variations, modifications and/or additions which fall within the spirit and scope of the above description.

The invention claimed is:

1. A transfer assembly for transferring first and second groups of electronic components simultaneously, comprising:
  a holding plate containing first and second sets of suction holes, wherein the respective first and second sets of suction holes are operative to hold the first and second groups of electronic components respectively against the holding plate during transfer of the electronic components;
  a first vacuum chamber located next to the holding plate which is connected only to the first set of suction holes;
  a vacuum compartment located within the first vacuum chamber and which encloses a second vacuum chamber that is separate from the first vacuum chamber, the vacuum compartment including a sealing sheet in contact with the holding plate, the sealing sheet having vacuum holes connecting the second vacuum chamber to the second set of suction holes; and
  a first vacuum source for applying vacuum suction force in the first vacuum chamber but not the second vacuum chamber, and a second vacuum source for applying suction force in the second vacuum chamber but not the first vacuum chamber.

2. The transfer assembly as claimed in claim 1, wherein the sealing sheet comprises multiple protrusions having vacuum holes and recessed slots located between adjacent protrusions, the protrusions being located at positions of the second set of suction holes and the recessed slots being located at positions of the first set of suction holes.

3. The transfer assembly as claimed in claim 1, wherein the sealing sheet is made from a compliant material.

4. The transfer assembly as claimed in claim 2, wherein the compliant material is rubber.

5. The transfer assembly as claimed in claim 2, wherein the multiple protrusions are arranged diagonally across the sealing sheet in multiple rows.

6. The transfer assembly as claimed in claim 2, wherein the recessed slots are interconnected to form a continuous passageway to enable fluid communication between each suction hole of the first set of suction holes and the first vacuum chamber.

7. The transfer assembly as claimed in claim 1, further comprising a sealing sheet support on which the sealing sheet is mounted, wherein the sealing sheet support forms a wall of the vacuum compartment.

8. The transfer assembly as claimed in claim 1, wherein the sealing sheet is operative to seal the second set of suction holes such that a first pneumatic path leading from the first set of suction holes to the first vacuum source is separated from a second pneumatic path leading from the second set of suction holes to the second vacuum source.

9. The transfer assembly as claimed in claim 1, further comprising a base block enclosing the first vacuum chamber to which the holding plate is removably attachable.

10. The transfer assembly as claimed in claim 1, wherein the sealing sheet is supported on a sealing sheet support which is insertable into the first vacuum chamber after removal of the holding plate, the sealing sheet support further enclosing the second vacuum chamber.

11. The transfer assembly as claimed in claim 1, wherein the first set of suction holes is located next to the second set of suction holes, and each hole of the first and second sets of suction holes is spaced at an equal distance from at least one adjacent hole, each hole of the first set of suction holes being located adjacent to at least one hole of the second set of suction holes.

12. A transfer assembly for transferring first and second groups of electronic components simultaneously, comprising:
  a holding plate containing first and second sets of suction holes, wherein the respective first and second sets of suction holes are operative to hold the first and second groups of electronic components respectively against the holding plate during transfer of the electronic components;
  a sealing sheet in contact with the holding plate, the sealing sheet having vacuum holes connecting to the second set of suction holes;
  a first vacuum chamber located next to the holding plate which surrounds side surfaces of the sealing sheet and is connected only to the first set of suction holes;
  a second vacuum chamber that is separate from the first vacuum chamber, the vacuum holes of the sealing sheet connecting the second vacuum chamber to the second set of suction holes;
  a first vacuum source for applying vacuum suction force in the first vacuum chamber; and
  a second vacuum source for applying vacuum suction force in the vacuum holes of the sealing sheet.

* * * * *